(12) United States Patent
Junhua

(10) Patent No.: US 6,803,703 B2
(45) Date of Patent: Oct. 12, 2004

(54) PIEZOELECTRIC ACTUATOR, LIQUID JETTING HEAD INCORPORATING THE SAME, AND METHOD OF MANUFACTURING THE ACTUATOR AND HEAD

(75) Inventor: Chang Junhua, Nagano (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/388,590

(22) Filed: Mar. 17, 2003

(65) Prior Publication Data

US 2003/0193268 A1 Oct. 16, 2003

(30) Foreign Application Priority Data

| Mar. 18, 2002 | (JP) | P2002-075089 |
| Jul. 8, 2002 | (JP) | P2002-199179 |
| Mar. 14, 2003 | (JP) | P2003-070547 |

(51) Int. Cl.⁷ .............................................. H01L 41/09
(52) U.S. Cl. ...................................... 310/359; 310/328
(58) Field of Search .................... 310/328, 366, 310/359, 322, 330, 331; 347/68–721; H01L 41/09

(56) References Cited

U.S. PATENT DOCUMENTS 6,504,287 B2   1/2003   Yun et al.

FOREIGN PATENT DOCUMENTS

| EP | 0 709 195 A1 | 5/1996 |
| EP | 0 803 918 A1 | 10/1997 |
| JP | 2-289352 | 11/1990 |
| JP | 3-128681 | 5/1991 |
| JP | 9-277531 | 10/1997 |
| JP | 09-277531 | * 10/1997 | ............ B41J/2/045 |
| JP | 9-323410 | 12/1997 |
| JP | 10-34924 | 2/1998 |
| JP | 11-5305 | 1/1999 |
| JP | 2000-77438 | 3/2000 |
| JP | 2000-141647 | 5/2000 |
| JP | 2000-332313 | 11/2000 |
| JP | 2001-77438 | 3/2001 |
| WO | WO 02/073710 A1 | 9/2002 |

* cited by examiner

Primary Examiner—Thomas M Dougherty
Assistant Examiner—Karen Beth Addison
(74) Attorney, Agent, or Firm—Sughrue Mion, PLLC

(57) ABSTRACT

A first common electrode to be fixed at a predetermined potential is formed on a vibration plate. The first common electrode has a first proximal portion and first branch portions extended from the proximal portion. A first piezoelectric layer is laminated on each of the first branch portions. A drive electrode is laminated on each first piezoelectric layer. A second piezoelectric layer is laminated on each drive electrode. A second common electrode to be fixed at the predetermined potential has a second proximal portion and second branch portions extended from the proximal portion such that each of the second branch portions is laminated on each second piezoelectric layer. A conduction member electrically connects the first proximal portion and the second proximal portion.

6 Claims, 8 Drawing Sheets

PIEZOELECTRIC ACTUATOR, LIQUID JETTING HEAD INCORPORATING THE SAME, AND METHOD OF MANUFACTURING THE ACTUATOR AND HEAD

BACKGROUND OF THE INVENTION

This invention relates to a piezoelectric actuator having a piezoelectric element as a drive source on a vibration plate surface, a liquid jetting head incorporating such an actuator, and a method of manufacturing method such an actuator and such a head.

Piezoelectric elements become deformed as electric energy is supplied, and are used widely as drive elements for a liquid jetting head, a micropump, and a sounding body (loudspeaker, etc.), for example. Here, the piezoelectric element comprised of a piezoelectric material which shows a piezoelectric effect, such as a piezoelectric ceramics made by compressing and baking metal oxide powder (e.g., $BaTiO_3$, $PbZrO_3$, $PbTiO_3$), a piezoelectric polymer film using polymer compound. The liquid jetting head ejects a liquid droplet from a nozzle orifice by causing pressure fluctuation to occur in liquid in a pressure chamber; the liquid jetting heads include a recording head used with an image recording apparatus such as a printer, a liquid crystal jetting head used for manufacturing a liquid crystal display, a color material jetting head used for manufacturing a color filter, and the like, for example. The micropump is a microminiature pump capable of handing a trace amount of liquid; for example, it is used to send an extremely small amount of a liquid medicine.

One of important parts used with such a liquid jetting head and a micropump is a piezoelectric actuator having a piezoelectric element on the surface of a vibration plate. The piezoelectric actuator is attached to a chamber formation plate having a hollow to be a pressure chamber which is partly defined by the vibration plate. To eject a liquid droplet or send liquid, a drive pulse is supplied to the piezoelectric element for deforming the piezoelectric element and the vibration plate (namely, the deforming portion of the pressure chamber) and thereby changing the volume of the pressure chamber.

In the liquid jetting head and the micropump, there is strong demand for high-frequency driving of the piezoelectric element to realize high-frequency ejecting of liquid droplets and enhance the liquid sending capability. To realize high-frequency driving of the piezoelectric element, it is necessary to make compliance of the deformed portion smaller than ever and make the deformation amount of the piezoelectric element larger than ever, because if the compliance of the deformed portion is made smaller, responsibility is improved and thus it is made possible to drive at a higher frequency than ever, while if the deformation amount of the piezoelectric element is made larger, the volume change amount of the pressure chamber grows and thus the amount of ejected liquid droplet and the amount of sent liquid can be increased.

A piezoelectric element having a multilayer structure is proposed to meet the contradictory requirements for the compliance of the deformed portion and the deformation amount of the piezoelectric element. For example, Japanese Patent Publication No. 2-289352A discloses a piezoelectric element having a structure wherein a piezoelectric body layer is made of a two-layer structure of an upper piezoelectric body and a lower piezoelectric body, a drive electrode (discrete electrode) is formed on the boundary between the upper piezoelectric body and the lower piezoelectric body, and the upper piezoelectric body and the lower piezoelectric body are formed each on an external surface with a common electrode. Likewise, Japanese Patent Publication No. 10-34924A also discloses a piezoelectric element having a multilayer structure.

In the multi-layered piezoelectric elements described above, the drive electrode is placed on the boundary between the upper piezoelectric body and the lower piezoelectric body and thus each of the upper and lower piezoelectric bodies is given an electric field of the strength determined by the spacing from the drive electrode to each common electrode (namely, the thickness of each piezoelectric body) and the potential difference between the drive electrode and each common electrode. Thus, as compared with a piezoelectric element having a single-layer piezoelectric body sandwiched between a common electrode and a drive electrode, the double-layered piezoelectric element can be largely deformed as the same drive voltage as ever is applied even if the whole piezoelectric element is slight thickened to enhance rigidity.

In fact, however, the piezoelectric element of the multilayer structure described above is not yet commercially available. Thus, the piezoelectric element having a single-layer piezoelectric body sandwiched between a common electrode and a drive electrode must be used as an actual product. Various reasons are possible; it is also considered as one reason that it is difficult to obtain an assembly including the multi-layered piezoelectric elements having uniform piezoelectric body characteristics.

SUMMARY OF THE INVENTION

It is therefore an object of the invention to obtain a piezoelectric actuator provided with multi-layered piezoelectric elements having highly unified piezoelectric body characteristics, and a liquid jetting head incorporating such an actuator.

It is also an object of the invention to provide a method of manufacturing such a piezoelectric actuator and such a liquid jetting head.

In order to achieve the above objects, according to the invention, there is provided a piezoelectric actuator, comprising:

a vibration plate;

a first common electrode, formed on the vibration plate and to be fixed at a predetermined potential, the first common electrode having a first proximal portion and first branch portions extended from the proximal portion;

a first piezoelectric layer, laminated on each of the first branch portions;

a drive electrode, laminated on each first piezoelectric layer;

a second piezoelectric layer, laminated on each drive electrode;

a second common electrode, having a second proximal portion and second branch portions extended from the proximal portion such that each of the second branch portions is laminated on each second piezoelectric layer and to be fixed at the predetermined potential; and a conduction member, which electrically connects the first proximal portion and the second proximal portion.

According to the invention, there is also provided a liquid jetting head, comprising the above actuator unit such that each of the first branch portions is associated with a pressure chamber communicated with a nozzle orifice from which a liquid droplet is ejected.

According to the invention, there is also provided a method of manufacturing a piezoelectric actuator, comprising steps of:

providing a vibration plate;

forming a first common electrode on the vibration plate so as to have a first proximal portion and first branch portions extended from the proximal portion;

laminating a first piezoelectric layer on each of the first branch portions;

laminating a drive electrode on each first piezoelectric layer;

laminating a second piezoelectric layer on each drive electrode;

forming a second common electrode having a second proximal portion and second branch portions extended from the proximal portion such that each of the second branch portions is laminated on each second piezoelectric layer, while the first common electrode and the second common electrode are insulated from each other; and connecting electrically the first proximal portion and the second proximal portion.

Preferably, the manufacturing method further comprising steps of:

measuring first piezoelectric characteristics of the first piezoelectric layer before the first proximal portion and the second proximal portion are electrically connected; and classifying the actuator into one of predetermined ranks in accordance with the measured first piezoelectric characteristics.

Preferably, the manufacturing method further comprising steps of:

measuring second piezoelectric characteristics of the second piezoelectric layer before the first proximal portion and the second proximal portion are electrically connected; and classifying the actuator into one of predetermined ranks in accordance with the measured second piezoelectric characteristics.

According to the invention, there is also provided a method of manufacturing a liquid jetting head, comprising steps of:

providing the actuator unit manufactured by the above method;

providing a flow passage unit formed with pressure chambers each communicated with a nozzle orifice from which a liquid droplet is ejected; and joining the actuator unit and the flow passage unit such that each of the first branch portions is associated with one of the pressure chambers.

In the above configuration, since the first common electrode and the second common electrode are electrically insulated when they are formed. the piezoelectric body characteristics can be separately measured for each of the upper piezoelectric body and the lower piezoelectric body. Accordingly, a product having highly unified piezoelectric body characteristics of the piezoelectric elements can be obtained.

DETAILED DESCRIPTION OF THE PREFERRED EMBODIMENTS

Figure 11:
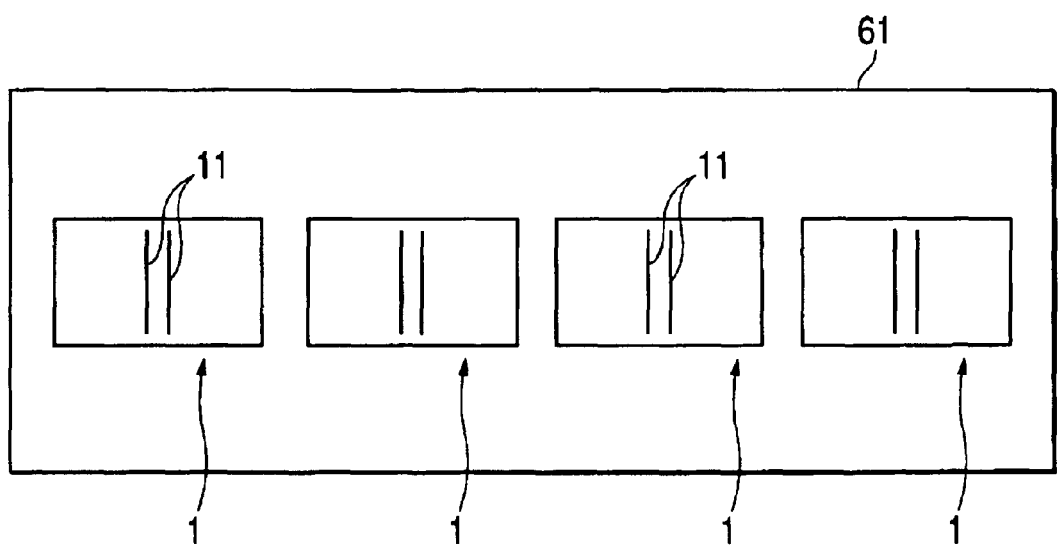
FIG. 11 is a plan view showing a recording head having a plurality of head bodies.

Referring now to the accompanying drawings, preferred embodiments of the invention will be described below. In the description that follows, a recording head installed in an image recording apparatus such as a printer or a plotter is taken as an example. The recording head has a plurality of head bodies 1 attached to an attachment base 61, for example, as shown in FIG. 11.

Figure 1:
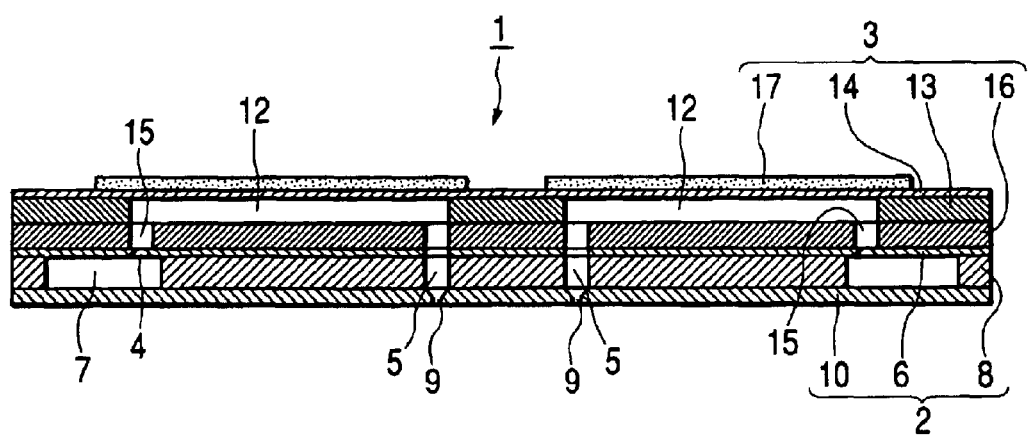
FIG. 1 is a section view to describe the basic structure of a head body according to a first embodiment of the invention.

To begin with, the basic structure of the head body 1 according to a first embodiment of the invention will be discussed with reference to FIGS. 1 and 2. The head body 1 is roughly made up of a flow passage unit 2 and an actuator unit 3.

The flow passage unit 2 is made up of a supply port formation plate 6 formed with through holes used as a part of an ink supply port (orifice) 4 and a part of each nozzle communication port 5, a reservoir formation plate 8 formed with through holes used as a common ink reservoir 7 and a part of each nozzle communication port 5, and a nozzle plate 10 having nozzle orifices 9 made along a subscanning direction (direction orthogonal to the main scanning direction in which the recording head is moved). The supply port formation plate 6, the reservoir formation plate 8, and the nozzle plate 10 are manufactured by pressing a stainless steel plate material, for example.

To manufacture the flow passage unit 2, the nozzle plate 10 is placed on one surface of the reservoir formation plate 8 (the lower side in the figure) and the supply port formation plate 6 is placed on an opposite surface of the reservoir formation plate 8 (the upper side in the figure) and the supply port formation plate 6, the reservoir formation plate 8, and the nozzle plate 10 are joined, for example, with a sheet-like adhesive.

Figure 2:
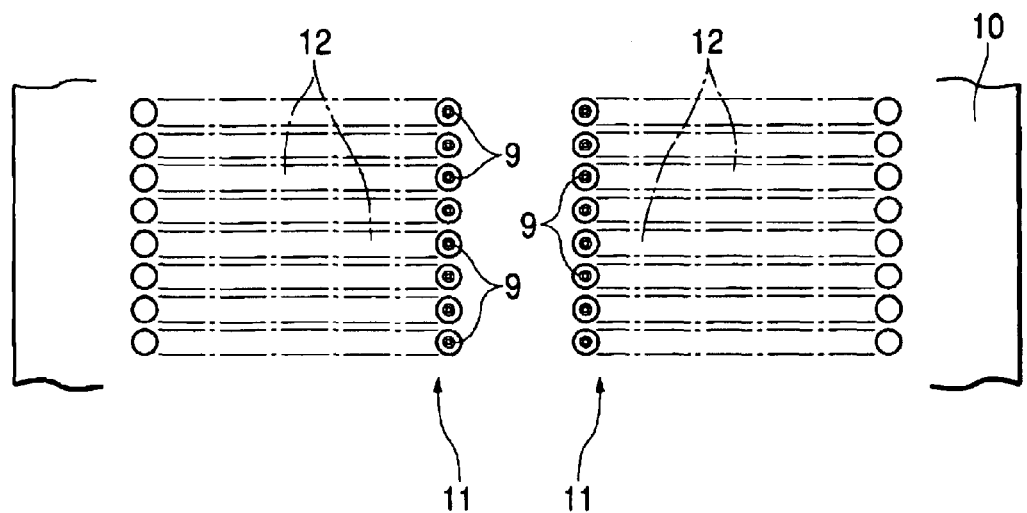
FIG. 2 shows the head body of the first embodiment viewed from a nozzle plate.

The nozzle orifices 9 are made like rows at predetermined pitches to form nozzle rows 11 as shown in FIGS. 2 and 11. For example, 92 nozzle orifices 9 make up one nozzle row 11, and the two nozzle rows 11 are formed side by side.

The actuator unit 3 is a member also called a head chip. The actuator unit 3 is made up of a chamber formation plate 13 formed with through holes used as pressure chambers 12, a vibration plate 14 for defining a part of each pressure chamber, a lid member 16 formed with through holes used as a supply communication port 15 and a part of each nozzle communication port 5, and piezoelectric elements 17 as drive sources. As for the plate thicknesses of the members 13, 14, and 16, preferably each of the chamber formation plate 13 and the lid member 16 is 50 $\mu$m or more, more preferably 100 $\mu$m or more. Preferably, the vibration plate 14 is 50 $\mu$m or less, more preferably about 3 to 12 $\mu$m.

In the actuator unit 3, the vibration plate 14 and the piezoelectric elements 17 make up a piezoelectric actuator unit of the invention. The vibration plate 14 serves as a support member on which the piezoelectric elements 17 are placed.

To manufacture the actuator unit 3, the lid member 16 is placed on one surface of the chamber formation plate 13 and the vibration plate 14 is placed on an opposite surface and the members are joined and then the piezoelectric elements 17 are formed on the surface of the vibration plate 14. The chamber formation plate 13, the vibration plate 14, and the lid member 16 are made of ceramics of alumina, zirconium oxide, etc., and are baked to be joined with each other.

The chamber formation plate 13, the vibration plate 14, and the lid member 16 are joined, for example, according to the following procedure: First, slurry of ceramics is prepared using ceramic raw material, a binder, a liquid medium, etc. Next, the slurry is formed to a green sheet (unbaked sheet member) using a general device such as a doctor blade device, a reverse roll coater, etc. Then, work of cutting, punching, etc., is performed on the green sheet to form necessary through holes, etc., for forming each sheet-like precursor of the chamber formation plate 13, the vibration plate 14, and the lid member 16. The sheet-like precursors are laid up on each other and are baked, whereby they are put into one piece to form one sheet-like member. In this case, the sheet-like precursors are baked in one piece and therefore a special adhesion treatment is not required. A high sealing property can also be provided on the joint faces of the sheet-like precursors.

One sheet-like member is formed with pressure chambers 12, nozzle communication ports 5, etc., of a plurality of units. In other words, a plurality of actuator units (head chips) 3 are manufactured from one sheet-like member. For example, a plurality of chip areas each to form one actuator unit 3 are set like a matrix within one sheet-like member. Necessary members of the piezoelectric elements 17, etc., are formed in each chip area and then the sheet-like member (ceramic sheet) is cut for each chip area, whereby a plurality of actuator units 3 are provided.

The pressure chambers 12 are each a hollow elongated in a direction orthogonal to the nozzle row 11 and are formed in a one-to-one correspondence with the nozzle orifices 9. That is, the pressure chambers 12 are placed like a row in the nozzle row direction, as shown in FIG. 2. Each pressure chamber 12 communicates at one end with the corresponding nozzle orifice 9 through the nozzle communication port 5. The pressure chamber 12 communicates at an opposite end to the nozzle communication port 5 with the common ink reservoir 7 through the supply communication port 15 and the ink supply port 4. Further, a part of the pressure chamber 12 is defined by the vibration plate 14.

Figure 3:
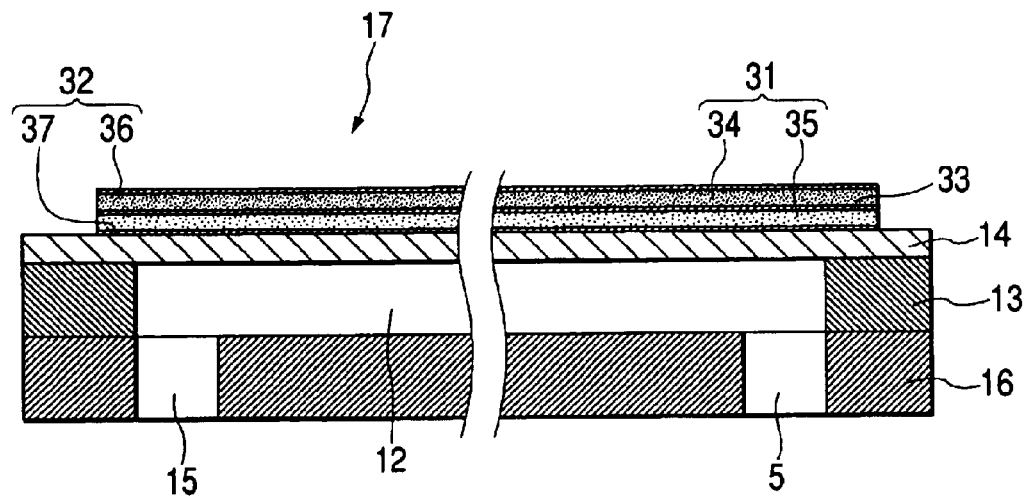
FIG. 3 is a section view showing an actuator unit of the first embodiment along with a longitudinal direction of a pressure chamber.
Figure 4:
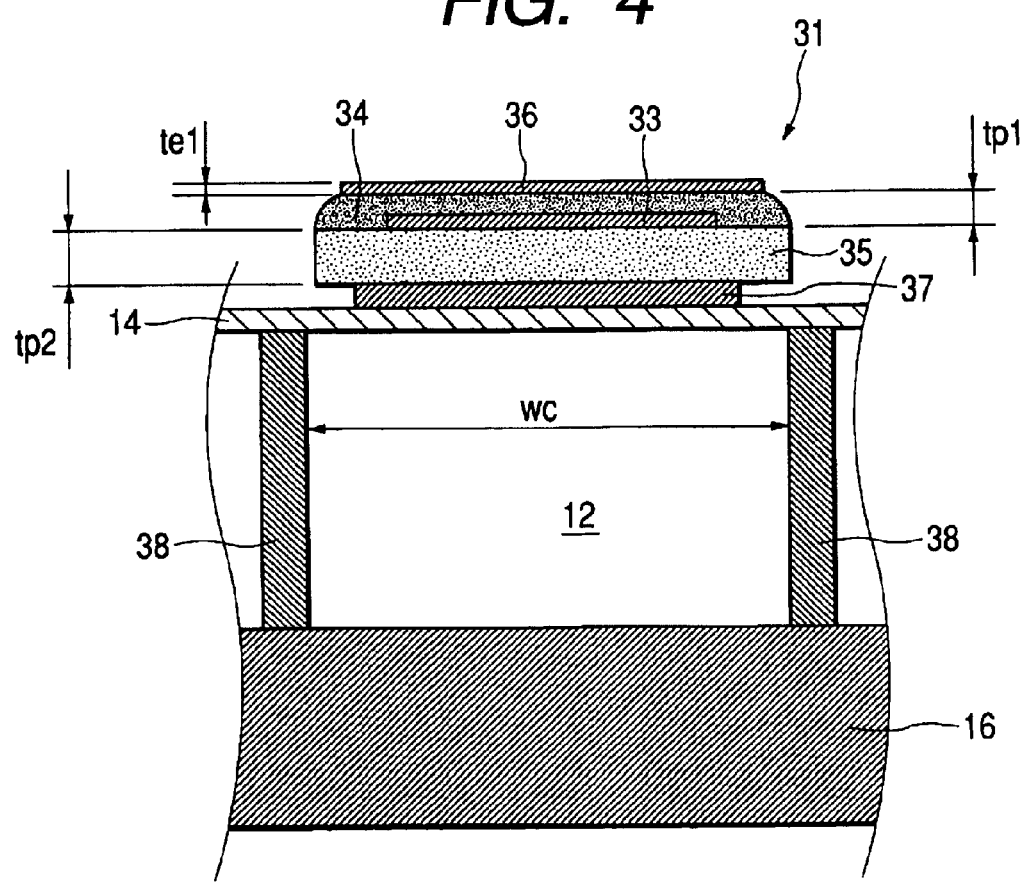
FIG. 4 is a section view showing the actuator unit of the first embodiment along with a widthwise direction of the pressure chamber.

The piezoelectric elements 17 are each a piezoelectric element in deflection vibration mode and are formed in a one-to-one correspondence with the pressure chambers 12 on the vibration plate surface opposite to the pressure chambers 12. The piezoelectric element 17 has a width roughly equal to that of the pressure chamber 12 and a length slight longer than that of the pressure chamber 12. That is, the piezoelectric element 17 is formed so as to cover the pressure chamber 12 in the length direction thereof. The piezoelectric element 17 has a multilayer structure including a piezoelectric body layer 31, a common electrode 32, a drive electrode 33, etc., and the piezoelectric body layer 31 is sandwiched between the drive electrode 33 and the common electrode 32, for example, as shown in FIG. 3. The detailed structure of the piezoelectric element 17 is described later in detail.

A supply source (not shown) of a drive signal is electrically connected to the drive electrode 33 and the common electrode 32 is adjusted to ground potential, for example. When a drive signal is supplied to the drive electrode 33, an electric field of the strength responsive to the potential difference is generated between the drive electrode 33 and the common electrode 32. The electric field is given to the piezoelectric body layer 31, which then becomes deformed in response to the strength of the given electric field. That is, the higher the potential of the drive electrode 33, the more contracted the piezoelectric body layer 31 in the direction orthogonal to the electric field, deforming the vibration plate 14 so as to lessen the volume of the pressure chamber 12. On the other hand, the lower the potential of the drive electrode 33, the more extended the piezoelectric body layer 31 in the direction orthogonal to the electric field, deforming the vibration plate 14 so as to increase the volume of the pressure chamber 12.

The actuator unit 3 and the flow passage unit 2 are joined to each other. For example, a sheet-like adhesive is placed between the supply port formation plate 6 and the lid member 16 and in this state, the actuator unit 3 is pressed against the flow passage unit 2, whereby the actuator unit 3 and the flow passage unit 2 are joined.

In the described head body 1, ink flow passages each from the common ink reservoir 7 through the ink supply port 4, the supply communication port 15, the pressure chamber 12, and the nozzle communication port 5 to the nozzle orifice 9 are formed in a one-to-one correspondence with the nozzle orifices 9. At the operating time, the ink flow passage fills with ink (a kind of liquid). As the piezoelectric element 17 is deformed, the corresponding pressure chamber 12 is contracted or expanded and pressure fluctuation occurs in ink in the pressure chamber 12. As the ink pressure is controlled, an ink droplet can be ejected from the nozzle orifice 9. For example, if the pressure chamber 12 of a stationary volume is once expanded and then rapidly contracted, the pressure chamber 12 is filled with ink as the pressure chamber 12 is expanded, and then the ink in the pressure chamber 12 is pressurized because of the later rapid contraction of the pressure chamber 12, ejecting an ink droplet.

To execute high-speed recording, a larger number of ink droplets need to be ejected in a short time. To meet the requirement, it is necessary to consider compliance of the vibration plate 14 of the portion defining the pressure chamber 12 and the piezoelectric element 17 (namely, the deformed portion in the pressure chamber 12) and the deformation amount of the piezoelectric element 17. The reason why the compliance and the deformation amount need to be considered is that as the compliance of the deformed portion increases, responsibility to the deformation worsens and it becomes difficult to drive at a high frequency and that as the compliance of the deformed portion lessens, the portion becomes hard to deform and the contraction amount of the pressure chamber 12 lessens, decreasing the ink amount of one droplet.

From the viewpoints, in a recording head using the piezoelectric elements in the deflection vibration mode already in the actual use, the piezoelectric elements each having a single-layer piezoelectric body sandwiched between a common electrode and a drive electrode are used; the maximum response frequency is about 25 kHz and the maximum ink droplet amount is about 13 pL (picoliters).

In the embodiment, the piezoelectric elements 17 each of a multilayer structure are used to lessen the compliance of the vibration plate 14 and further the structure of the piezoelectric element 17 is improved, whereby it is made possible to eject an ink droplet of the necessary amount at a higher frequency than ever. This point will be discussed below:

To begin with, the structure of the piezoelectric element 17 will be discussed in detail. As shown in FIG. 3, the piezoelectric body layer 31 is made up of an upper piezoelectric body (outer piezoelectric body) 34 and a lower piezoelectric body (inner piezoelectric body) 35 deposited on each other. The common electrode 32 is made up of an upper common electrode (outer common electrode) 36 and a lower common electrode (inner common electrode) 37. The common electrode 32 and the drive electrode 33 (discrete electrode) make up an electrode layer.

The term "upper (outer)" or "lower (inner)" mentioned here is used to indicate the position relationship with the vibration plate 14 as the reference. In other words, it is used to indicate the position relationship based on the joint face of the piezoelectric element 17 to the vibration plate 14, which can also be represented as the action face for outputting deformation of the piezoelectric element 17. The term "upper (outer)" is used to indicate the side distant from the vibration plate 14 and the term "lower (inner)" is used to indicate the side near to the vibration plate 14.

The drive electrode 33 is formed on the boundary between the upper piezoelectric body 34 and the lower piezoelectric body 35, and the lower common electrode 37 is formed between the lower piezoelectric body 35 and the vibration plate 14. The upper common electrode 36 is formed on the surface of the upper piezoelectric body 34 on the opposite side to the lower piezoelectric body 35. That is, the piezoelectric element 17 is of a multilayer structure wherein the lower common electrode 37, the lower piezoelectric body 35, the drive electrode 33, the upper piezoelectric body 34, and the upper common electrode 36 are laminated in order from the vibration plate side. The piezoelectric body layer 31 has a thickness of about 17 $\mu$m (the thickness of the upper piezoelectric body 34 plus the thickness of the lower piezoelectric body 35). The total thickness of the piezoelectric element 17 including the common electrode 32 is about 20 $\mu$m.

The related-art piezoelectric element of the multilayer structure has a total thickness of about 15 $\mu$m. Therefore, as the thickness of the piezoelectric element 17 increases, the compliance of the vibration plate 14 lessens accordingly.

The upper common electrode 36 and the lower common electrode 37 are adjusted to a constant potential regardless of a drive signal. In the embodiment, the upper common electrode 36 and the lower common electrode 37 are formed in an electric insulating state and then are electrically connected to each other. At the operating time, the upper common electrode 36 and the lower common electrode 37 are adjusted to ground potential, for example. The drive electrode 33 is electrically connected to the supply source of a drive signal as mentioned above, and is changed in potential in response to the supplied drive signal. Therefore, as the drive signal is supplied, electric fields opposite in direction occur between the drive electrode 33 and the upper common electrode 36 and between the drive electrode 33 and the lower common electrode 37.

As materials forming the electrodes 33, 36, and 37, various conductors of discrete metal, an alloy, a mixture of electric insulating ceramics and metal, and the like can be selected, but it is required that a defective condition of deterioration, etc., should not occur at the baking temperature. In the embodiment, gold is used for the upper common electrode 36 and platinum is used for the lower common electrode 37 and the drive electrode 33.

Both the upper piezoelectric body 34 and the lower piezoelectric body 35 are made of piezoelectric material consisting mainly of lead zirconate titanate (PZT), for example. The upper piezoelectric body 34 and the lower piezoelectric body 35 are opposite in polarization direction. Thus, the upper piezoelectric body 34 and the lower piezoelectric body 35 are identical in the extending or contraction direction when the drive signal is applied, and can deform the vibration plate 14 without a hitch. That is, as the potential of the drive electrode 33 is made higher, the upper piezoelectric body 34 and the lower piezoelectric body 35 deform the vibration plate 14 so as to lessen the volume of the pressure chamber 12; as the potential of the drive electrode 33 is made lower, the upper piezoelectric body 34 and the lower piezoelectric body 35 deform the vibration plate 14 so as to increase the volume of the pressure chamber 12.

To efficiently deform the piezoelectric element 17 of the multilayer structure, in the embodiment, the deformation degree of the upper piezoelectric body 34 as the drive signal is supplied is set larger than that of the lower piezoelectric body 35. That is, when the same drive signal is supplied, the upper piezoelectric body 34 is deformed more largely than the lower piezoelectric body 35. If the upper piezoelectric body 34 is thus deflected relatively more largely than the lower piezoelectric body 35, the upper piezoelectric body 34 is more distant from the vibration plate 14 than the lower piezoelectric body 35 and thus the deformation amount of the upper piezoelectric body 34 is amplified and acts on the vibration plate 14, making it possible to increase the deformation amount of the vibration plate 14.

Since the vibration plate 14 can be deformed largely, the volume of the pressure chamber at the contraction time can be more lessened. Therefore, the difference between the volume of the pressure chamber 12 at the expansion time and that at the contraction time can be more widened and the ink droplet ejection amount can be more increased as compared with the case where the piezoelectric element 17 of the multilayer structure is simply used.

The upper common electrode 36 uses an electrode material thinner and higher in flexibility than any other electrode (drive electrode, lower common electrode 37), because the upper common electrode 36 becomes deformed more largely than other electrodes. That is, the upper common electrode 36 is formed on the surface of the upper piezoelectric body 34 and thus becomes deformed more largely than other electrodes. Thus, the upper common electrode 36 uses a softer material than any other electrode and/or is thinned, whereby breakage of the upper common electrode 36 can be prevented as the upper common electrode 36 becomes repeatedly deformed. An electrode material having good conductivity may be used so as to prevent electric resistance from becoming excessively high if the upper common electrode 36 is thinned.

Specifically, as for the electrode materials, the upper common electrode 36 is made of gold and the drive electrode 33 and the lower common electrode 37 are made of platinum, as described above. The lower common electrode 37 and the drive electrode 33 are each 2 to 3 μm thick; the upper common electrode 36 (te1) has a thickness set to one-tenth that of the lower common electrode 37 or the drive electrode 33 (for example, 0.3 μm). This composition makes it possible to deform the upper common electrode 36 following the piezoelectric element 17 and prevent a defective condition of impairing the deformation amount of the piezoelectric element 17. If the piezoelectric element 17 is repeatedly deformed, a failure of a break, etc., is hard to occur. Further, an electric current can be allowed to efficiently flow through the upper common electrode 36.

Figure 5:
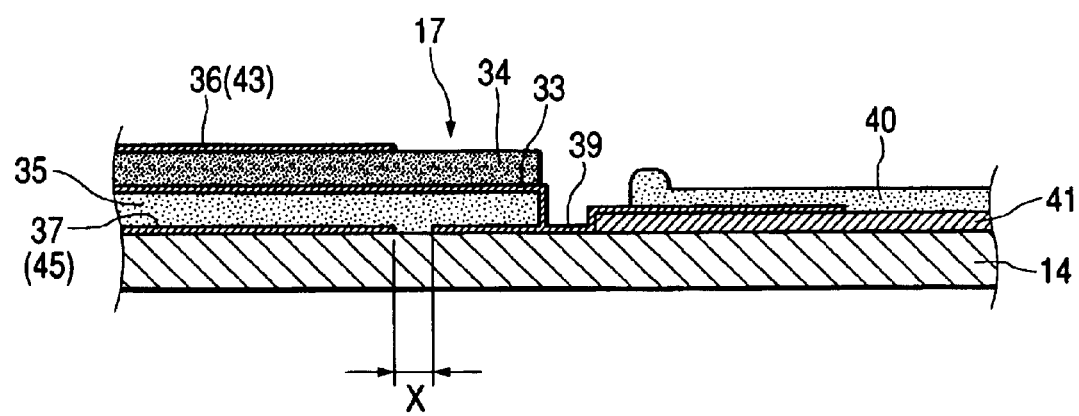
FIG. 5 is a section view showing the end part structure of a drive electrode of the first embodiment.

The drive electrode 33 is exposed to the outside of the piezoelectric element 17 at one end part of the piezoelectric element 17 and is electrically connected to a supply terminal 40 through a connection electrode 39, as shown in FIG. 5. The supply terminals 40 are each a contact terminal for supplying a drive signal and are formed in a one-to-one correspondence with the drive electrodes 33. A contact terminal (not shown) of a flexible flat cable (FFC) for supplying a drive signal is electrically connected to each supply terminal 40. Therefore, the drive signal is supplied through the supply terminal 40 and the connection electrode 39 to the corresponding drive electrode 33.

The connection electrode 39 is formed on the end face of the piezoelectric element 17, the surface of the vibration plate 14, and the surface of a terminal board 41 on which the supply terminal 40 is placed. Although the lower common electrode 37 is also formed on the surface of the vibration plate 14 as mentioned above, an insulating area X in which no electrode is formed is placed between the connection electrode 39 and the lower common electrode 37, so that the connection electrode 39 and the lower common electrode 37 are electrically insulated.

By the way, the piezoelectric elements 17 are formed in a one-to-one correspondence with the nozzle orifices 9 as mentioned above and thus the number of the piezoelectric elements 17 per nozzle row 11 is 92. Although the upper common electrode 36 and the lower common electrode 37 are electrically connected to each other, if both the common electrodes 36 and 37 are electrically connected for each piezoelectric element 17, work efficiency is poor and productivity cannot be improved. On the other hand, if both the common electrodes 36 and 37 are electrically connected when the common electrode 32 (36 and 37) is formed, in a case where the capacitance (a kind of piezoelectric body characteristic) or the like of each of the upper piezoelectric body 34 and the lower piezoelectric body 35 is measured for each piezoelectric element 17 (for each pressure chamber 12), such measurement must be conducted collectively with respect to the respective piezoelectric elements 17. In such a case, it is difficult to specify a problematic element.

In view of the above, in this embodiment, each of the upper common electrode 36 and the lower common electrode 37 is formed of a pectinated electrode made up of a proximal electrode and a plurality of branch electrodes and the piezoelectric body characteristic of the upper piezoelectric body 34 and that of the lower piezoelectric body 35 are measured separately and then the proximal electrodes are electrically connected to each other. That is, the upper common electrode 36 and the lower common electrode 37 are electrically insulated from each other at the electrode forming process, and the electrodes 36 and 37 are electrically connected after the piezoelectric body characteristics are measured. This point will be discussed below.

Figure 6:
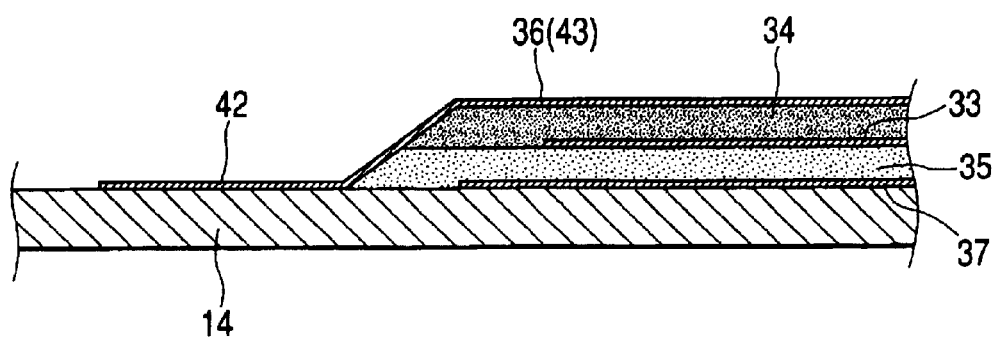
FIG. 6 is a section view showing the end part structure of an upper common electrode of the first embodiment.
Figure 7A:
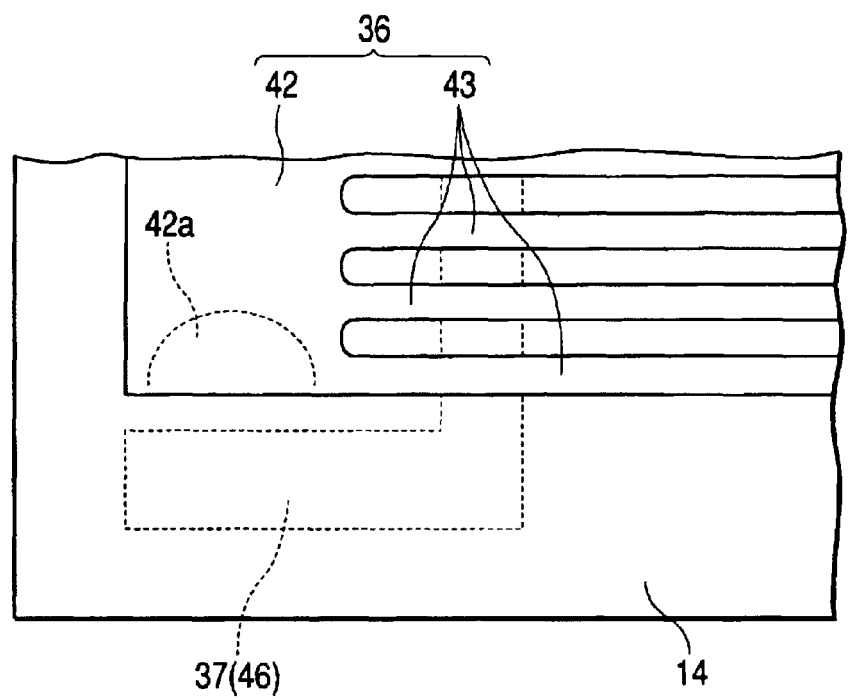
FIG. 7A is a plan view of the upper common electrode of the first embodiment.
Figure 7B:
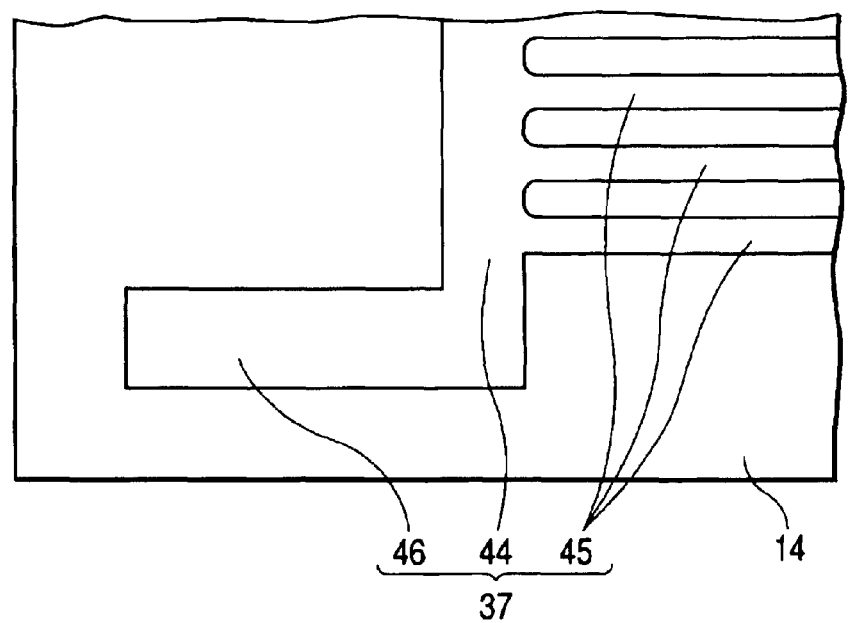
FIG. 7B is a plan view of a lower common electrode of the first embodiment.

As shown in FIGS. 5 to 7, the upper common electrode 36 is formed of a pectinated electrode made up of a strip-shaped proximal electrode 42 elongated parallel with the nozzle rows and a plurality of branch electrodes 43 extended from one side of the proximal electrode 42 so as to cover the surface of the piezoelectric element 17 (upper piezoelectric body 34).

The proximal electrode 42 is formed on the surface of the vibration plate 14 and has a width set sufficiently wider than that of the branch electrode 43 so as to allow an electric current to flow without a hitch if a drive signal is supplied to all piezoelectric elements 17 at the same time. The proximal electrode 42 is formed at an end part in the length direction with a conduction area 42a as shown in FIG. 7A. The conduction area 42a is used when the upper common electrode 36 and the lower common electrode 37 are electrically connected (described later). Each branch electrode 43 extends on the surface of the upper piezoelectric body 34 through a slope portion of one end of the piezoelectric body layer 31 as shown in FIG. 6.

The distal end of each branch electrode 43 is positioned away from the end face in the upper piezoelectric body 34 as shown in FIG. 5. The reason is that the end part of each branch electrode 43 and the drive electrode 33 are placed apart from each other, thereby preventing a defective condition of short-circuiting of the branch electrode 43 and the drive electrode 33 by atmospheric discharge.

The whole of the lower common electrode 37 is formed on the vibration plate surface; the lower common electrode 37 is formed of a pectinated electrode made up of a strip-shaped proximal electrode 44 elongated in parallel with the nozzle rows, a plurality of branch electrodes 45 formed in a one-to-one correspondence with the piezoelectric elements 17 (lower piezoelectric bodies 35) so as to extend from one side of the proximal electrode 44, and a conduction belt 46 extended from the other end of the proximal electrode 44 to the opposite side to the branch electrode 45.

The proximal electrode 44 has a width set sufficiently wider than that of the branch electrode 45 so as to allow an electric current to flow without a hitch if a drive signal is supplied to all piezoelectric elements 17 at the same time. The branch electrode 45 is positioned between the piezoelectric body layer 31 (lower piezoelectric body 35) and the vibration plate 14, and has a distal end matched with the upper common electrode 36 as shown in FIG. 5. The conduction belt 46 is used when the lower common electrode 37 is electrically connected to the upper common electrode 36. That is, the conduction belt 46 is formed at a position close to the conduction area 42a of the upper common electrode 36, and a conduction member 47 such as solder, etc., is placed in a state of straddling the conduction area 42a and the conduction belt 46, as shown in FIG. 8F. Therefore, to electrically connect both the common electrodes 36 and 37, the conduction member 47 needs only to be formed straddling the conduction area 42a and the conduction belt 46, and work can be simplified and is also suited for automation.

Next, a manufacturing procedure of the upper common electrode 36 and the lower common electrode 37 will be discussed with reference to FIGS. 8A to 8F. Both the common electrodes 36 and 37 are formed in the element forming process of forming the piezoelectric elements 17 on the vibration plate 14 (more concretely, a base material prior to be cut to obtain actuator units 3, but "vibration plate 14" for convenience in description).

Figure 8A:
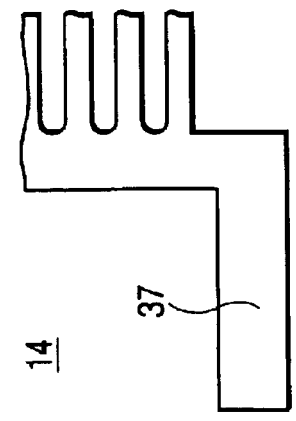
FIGS. 8A to 8F are schematic drawings showing the manufacturing process of a piezoelectric element of the first embodiment.

In the element forming process, first, as shown in FIG. 8A, the lower common electrode 37 is formed on the surface of the vibration plate 14. In the embodiment, the lower common electrode 37 is formed by printing. Therefore, first a mask is put on a predetermined position on the vibration plate 14 and platinum paste is applied to the surface of the vibration plate 14 via the mask. If platinum paste is applied, then the platinum paste is baked. That is, a sheet-like member having the platinum paste applied to the vibration plate surface (baked substance of precursors of chamber formation plate 13, vibration plate 14, and lid member 16) is entered in a baking furnace and is baked over a predetermined time period at a predetermined temperature. As the sheet-like member is baked, the lower common electrode 37 is formed on the surface of the vibration plate 14.

Figure 8B:
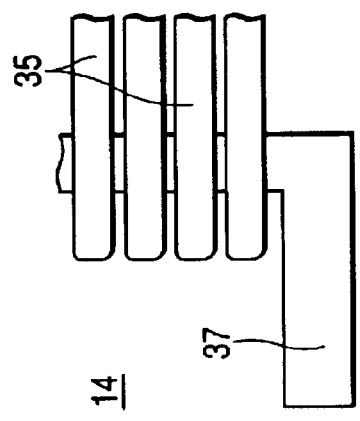
Figure 8C:
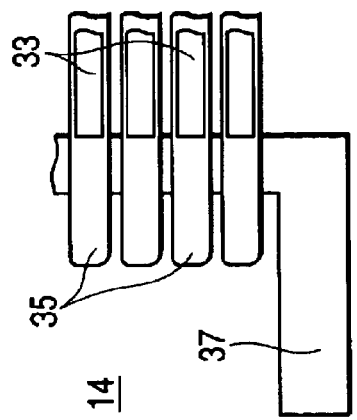
Figure 8D:
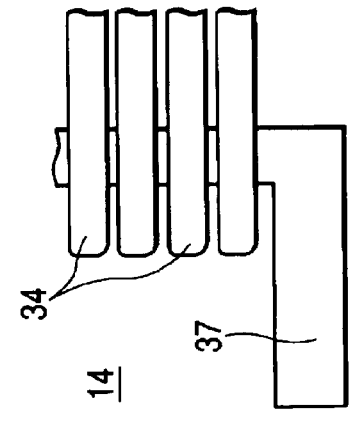
Figure 8E:
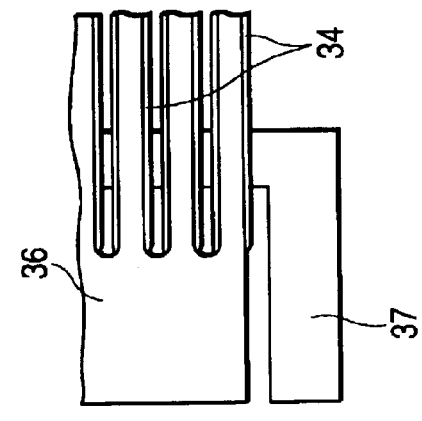
Figure 8F:
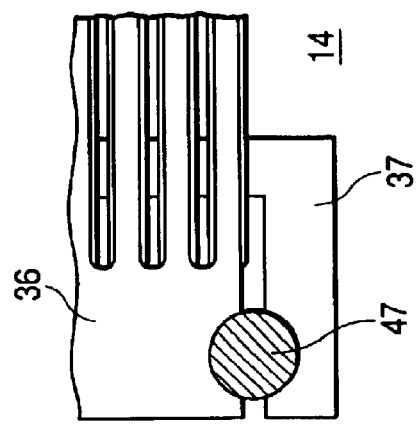

If the lower common electrode 37 is formed, then the lower piezoelectric bodies 35 are formed as shown in FIG. 8B. That is, a mask is put on a predetermined position on the vibration plate 14 and then paste of a piezoelectric material (for example, lead zirconate titanate) is applied to the surface of the vibration plate 14. The applied paste piezoelectric material is baked. After this, the drive electrodes 33, the upper piezoelectric bodies 34, and the upper common electrode 36 are formed in order in a similar manner as shown in FIGS. 8C to 8E. Specifically, the drive electrodes 33 are formed on the lower piezoelectric bodies 35; the upper piezoelectric bodies 34 are formed on the lower piezoelectric bodies 35 so as to cover the drive electrodes 33; and the upper common electrode 36 is formed on the surfaces of the upper piezoelectric bodies 34.

Upon completion of forming the upper common electrode 36, the process proceeds to a cutting process. In the cutting process, ceramic sheet (sheet-like member formed with the piezoelectric elements 17) is cut for each chip area to provide a plurality of actuator units 3

If the sheet is cut to the actuator units 3, the process proceeds to an inspection process and a check is made to ensure that the layers making up each piezoelectric element 17 are manufactured normally. In the embodiment, the capacitance correlated with the dimensions (for example, thickness and width) of the piezoelectric body layer is measured for each of the upper piezoelectric body 34 and the lower piezoelectric body 35 separately. That is, in the inspection process, both the common electrodes 36 and 37 are not yet electrically connected and thus the capacitance can be measured for each of the upper piezoelectric body 34 and the lower piezoelectric body 35 separately.

Upon completion of inspection of all piezoelectric elements 17 (for example, measurement of capacitance), whether or not the actuator unit 3 is available is determined based on the measured capacitance. Further, the actuator units 3 determined available are classified based on the measured capacitance. For example, the actuator units 3 are ranked based on the average capacitance of the actuator units 3 or based on the capacitance variation range.

Figure 9:
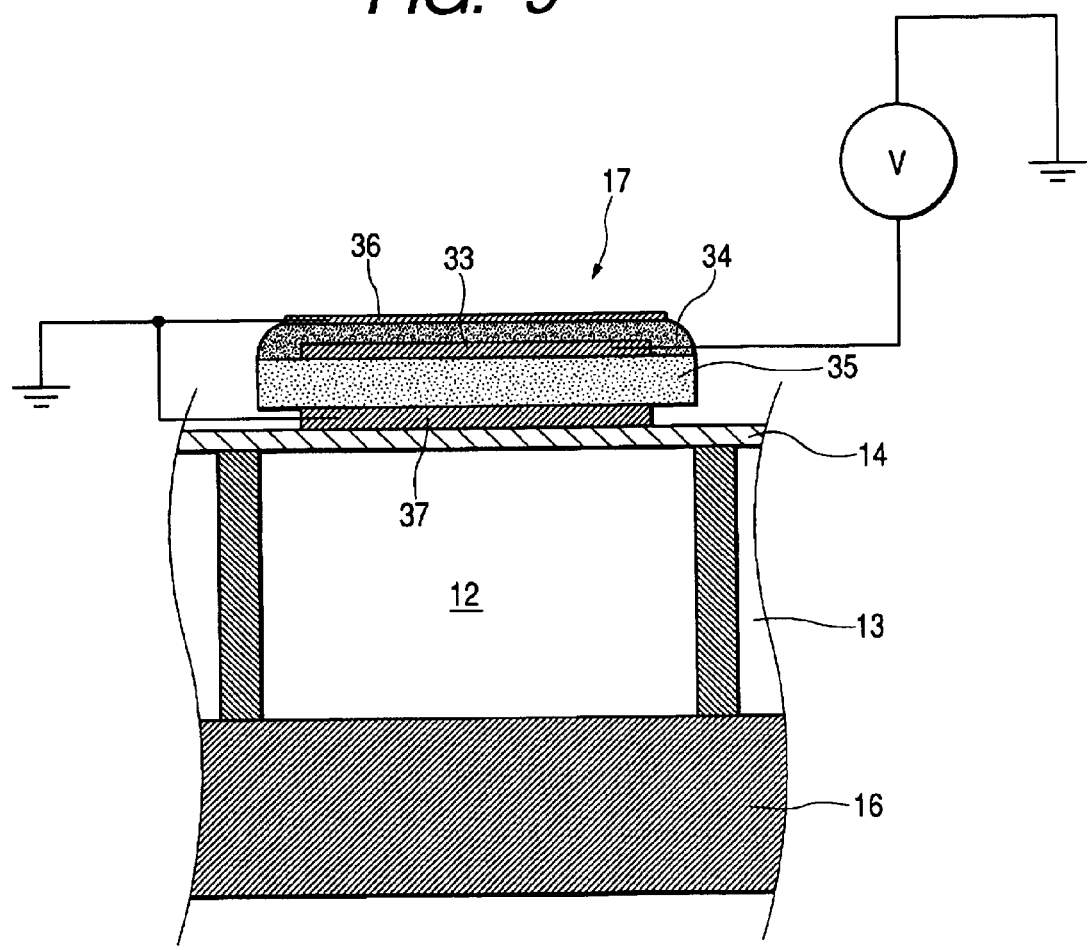
FIG. 9 is a schematic drawing showing polarizing of the piezoelectric element of the first embodiment.

After the actuator units 3 are classified, then the process proceeds to a polarization process of the manufactured piezoelectric element 17. The polarizing is to apply a strong electric field for making internal electric dipole uniform in a constant direction. For example, as shown in FIG. 9, both the upper common electrode 36 and the lower common electrode 37 are grounded and the drive electrode 33 is connected to a power supply. In this case, the polarizing is performed at a sufficiently higher voltage than the drive voltage to be used normally. In the embodiment, the drive voltage is about 30 V and thus the polarization voltage is set to about 70 V. If the polarization voltage is applied over a predetermined time, the polarizing is terminated.

If the upper piezoelectric body 34 and the lower piezoelectric body 35 are polarized, then the process proceeds to an electric connection process. In the electric connection process, electric connection of soldering, etc., is performed for the actuator unit 3 after undergoing the polarizing for electrically connecting the upper common electrode 36 and the lower common electrode 37 as shown in FIG. 8F. For example, solder, a bonding wire or the like serving as the conduction member 47 is placed in a state of straddling the conduction area 42a and the conduction belt 46.

Here, the polarization voltage is applied through the drive electrode 33 for performing the polarizing, so that the upper piezoelectric body 34 and the lower piezoelectric body 35 can be polarized collectively. Thus, workability is excellent. Since the upper common electrode 36 and the lower common electrode 37 are electrically insulated at the electrode forming time and are electrically connected after completion of measurement, the piezoelectric body characteristics of one piezoelectric element 17 can be separately measured for each of the upper piezoelectric body 34 and the lower piezoelectric body 35 in the inspection process. Accordingly, each actuator unit 3 having uniform piezoelectric body characteristics can be obtained. A defective condition on manufacturing can also be found out with high accuracy.

The example wherein each of the upper common electrode 36 and the lower common electrode 37 is formed as a pectinated electrode has been described, but either of the upper common electrode 36 and the lower common electrode 37 may be formed discretely for each piezoelectric element 17 and the upper common electrode 36 and the lower common electrode 37 may be electrically connected by a wiring member of a flexible flat cable, etc.

Figure 10A:
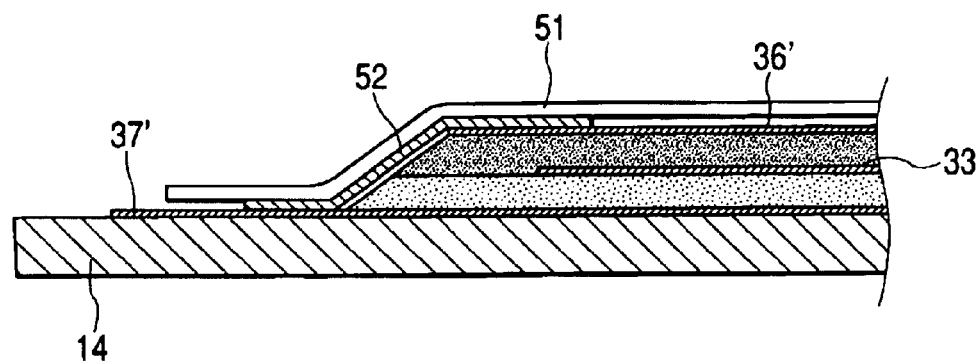
FIG. 10A is a section view of a piezoelectric element according to a second embodiment of the invention.
Figure 10B:
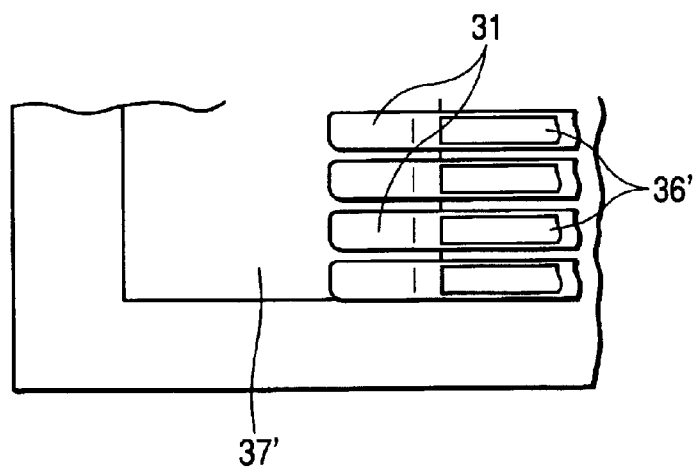
FIG. 10B is a plan view of the piezoelectric element of the second embodiment, showing a condition that a wiring member is not provided.
Figure 10C:
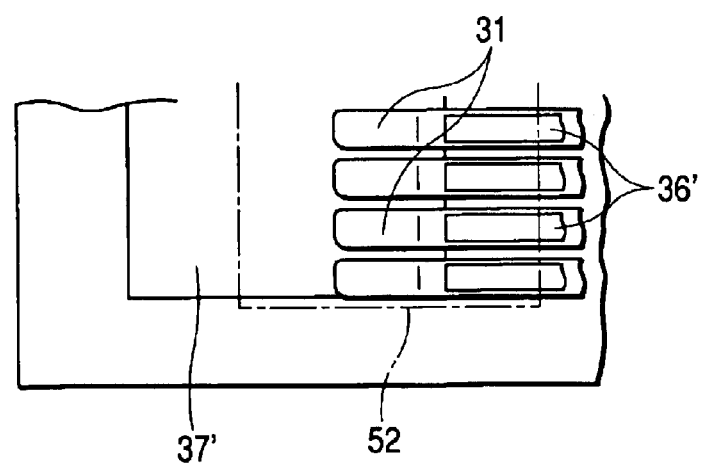
FIG. 10C is a plan view of the piezoelectric element of the second embodiment, showing a condition that a wiring member is provided.

In a second embodiment of the invention shown in FIGS. 10A to 10C, discrete upper common electrodes 36' are formed in a one-to-one correspondence with piezoelectric elements 17 and a lower common electrode 37' is formed pectinately. To electrically connect the upper common electrodes 36' and the lower common electrode 37', a wiring member 51 is provided. That is, a conductive layer 52 is formed like a plane in a connection part of the wiring member 51, and the conductive layer 52 is put over the lower common electrode 37' (proximal electrode) and the upper common electrodes 36' to join them.

In doing so, the piezoelectric body characteristics of one piezoelectric element 17 can be measured for each of the upper piezoelectric body 34 and the lower piezoelectric body 35 separately. Therefore, each actuator unit 3 having uniform piezoelectric body characteristics can be selected, and a defective condition on manufacturing can be found out with high accuracy.

The examples of applying the invention to the recording head of a kind of liquid jetting head and the piezoelectric actuator used with the recording head have been described, but the invention is not limited to the specific examples. For example, the invention can also be applied to other liquid jetting heads such as a liquid crystal jetting head and a color material jetting head and piezoelectric actuators for the liquid jetting heads. It can also be applied to piezoelectric actuators for a micropump and a sounding body.

What is claimed is:

1. A piezoelectric actuator, comprising:

a vibration plate;

a first common electrode, formed on the vibration plate and to be fixed at a predetermined potential, the first common electrode having a first proximal portion and first branch portions extended from the first proximal portion;

a first piezoelectric layer, laminated on each of the first branch portions;

a drive electrode, laminated on each first piezoelectric layer;

a second piezoelectric layer, laminated on each drive electrode;

a second common electrode, having a second proximal portion and second branch portions extended from the second proximal portion such that each of the second branch portions is laminated on each second piezoelectric layer and to be fixed at the pedetermined potential; and a conduction member, which electrically connects the first proximal portion and the second proximal portion.

2. A method of manufacturing a piezoelectric actuator, comprising steps of:

providing a vibration plate;

forming a first common electrode on the vibration plate so as to have a first proximal portion and first branch portions extended from the first proximal portion;

laminating a first piezoelectric layer on each of the first branch portions;

laminating a drive electrode on each first piezoelectric layer;

laminating a second piezoelectric layer on each drive electrode;

forming a second common electrode having a second proximal portion and second branch portions extended from the second proximal portion such that each of the second branch portions is laminated on each second piezoelectric layer, while the first common electrode and the second common electrode are insulated from each other; and connecting electrically the first proximal portion and the second proximal portion.

3. The manufacturing method as set forth in claim 2, further comprising steps of:

measuring first piezoelectric characteristics of the first piezoelectric layer before the first proximal portion and the second proximal portion are electrically connected; and classifying the actuator into one of predetermined ranks in accordance with the measured first piezoelectric characteristics.

4. The manufacturing method as set forth in claim 2, further comprising steps of:

measuring second piezoelectric characteristics of the second piezoelectric layer before the first proximal portion and the second proximal portion are electrically connected; and classifying the actuator into one of predetermined ranks in accordance with the measured second piezoelectric characteristics.

5. A liquid jetting head, comprising the actuator unit as set forth in claim 1 such that each of the first branch portions is associated with a pressure chamber communicated with a nozzle orifice from which a liquid droplet is ejected.

6. A method of manufacturing a liquid jetting head, comprising steps of:

providing the actuator unit manufactured by the method as set forth in claim 2; and providing a flow passage unit formed with pressure chambers each communicated with a nozzle orifice from which a liquid droplet is ejected; and joining the actuator unit and the flow passage unit such that each of the first branch portions is associated with one of the pressure chambers.

* * * * *